United States Patent
de Kleer

(10) Patent No.: US 8,271,257 B2
(45) Date of Patent: Sep. 18, 2012

(54) TROUBLESHOOTING TEMPORAL BEHAVIOR IN "COMBINATIONAL" CIRCUITS

(75) Inventor: Johan de Kleer, Los Altos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1125 days.

(21) Appl. No.: 11/942,234

(22) Filed: Nov. 19, 2007

(65) Prior Publication Data

US 2008/0294415 A1    Nov. 27, 2008

Related U.S. Application Data

(60) Provisional application No. 60/931,526, filed on May 24, 2007.

(51) Int. Cl.
G06F 17/50 (2006.01)
(52) U.S. Cl. .......................... 703/19; 716/106
(58) Field of Classification Search ................ 703/6, 13, 703/14, 19
See application file for complete search history.

(56) References Cited

U.S. PATENT DOCUMENTS

| | | | |
|---|---|---|---|
| 5,901,061 A | 5/1999 | Gaddis et al. | |
| 7,596,770 B1 * | 9/2009 | Kuehlmann et al. | 716/106 |
| 2002/0166089 A1 | 11/2002 | Noy | |
| 2003/0149916 A1 | 8/2003 | Ohtake et al. | |
| 2004/0088627 A1 | 5/2004 | Nishioka et al. | |
| 2005/0086566 A1 | 4/2005 | Thompson et al. | |
| 2005/0102596 A1 | 5/2005 | Hekmatpour | |
| 2005/0149790 A1 | 7/2005 | Yoshida et al. | |
| 2006/0200721 A1 | 9/2006 | Kobayashi | |

OTHER PUBLICATIONS

Dressler, Oskar, "An Extended Basic ATMS", Proceedings 2nd International NMR Workshop, LNAI 346 (Springer, 1988).*
Hamscher, Walter, "Principles of Diagnosis: Current Trends and a Report on the First International Workshop", AI Magazine, vol. 12, No. 4, 1991.*
Gamper, Johann, "A Temporal Reasoning and Abstraction Framework for Model-Based Diagnosis Systems", PhD Thesis D82, RWTH, Aachen, Germany, Jul. 1996.*
Dressler, Oskar, "On-Line Diagnosis of Dynamic Systems based on Qualitative Models and Dependency-recording Diagnosis Engines", Proceedings of the European Conference on Artificial Intelligence, ECAI-96, 2006.*
Int'l Search Report, PCT/US07/85516, Dated May 22, 2008, Authorized Office Lee W. Young.
De Kleer et al., "Diagnosing Multiple Faults", this paper is a correction (as of Mar. 22, 1992, pp. 100-117) of one which first appeared in *Artificial Intelligence*, 32(1):97-130, Apr. 1987 [also in: *Readings in NonMonotonic Reasoning*, edited by Matthew L. Ginsbert, (Morgan Kaufman, 1987), 280-297].
De Kleer et al., "Characterizing Diagnoses and Systems", pp. 54-65 [originally appeared in *Artificial Intelligence*, 56(2-3):197-222, 1992].

(Continued)

*Primary Examiner* — Mary C Jacob
(74) *Attorney, Agent, or Firm* — Fay Sharpe LLP

(57) ABSTRACT

A method and computer product is provided to generate a signal model for use in analyzing a model system including imposing an explicit time assumption for each time instant of the system model. The time assumptions are defined so that any two assumptions contradict each other, thereby separating all inferences into the respective times. A non-monotonic rule is applied to instantiate component models of the model system. Results are defined as not depending on the existence of a previous time instant and, a simplified signal model is generated, wherein the signal model represents the evolution of a value in the model system over time.

19 Claims, 9 Drawing Sheets

OTHER PUBLICATIONS

De Kleer, "Modeling When Connections Are the Problem". In the *Proc. 20th IJCAI*, 2007, pp. 310-317, Hyderabad, India.

Kuipers, "Qualitative Simulation", Qualitative Reasoning Group at the Artificial Intelligence Laboratory, The University of Texas at Austin, Feb. 26, 2001, pp. 1-22 [also in, *Artificial Intelligence*, 29(3):289-338, Sep. 1986; also in: D.S. Weld and J. de Kleer (eds.) *Readings in Qualitative Reasoning about Physical Systems* (Morgan Kaufmann, Los Altos, CA, 1990)].

Raiman et al., "Characterizing Non-Intermittent Faults", pp. 170-175, this paper originally appeared in *Proceedings AAAI-91*, Anaheim, CA (1991) 849-854.

U.S. Appl. No. 11/940,493, filed Nov. 15, 2007, de Kleer.

U.S. Appl. No. 11/928,444, filed Oct. 30, 2007, de Kleer.

U.S. Appl. No. 11/775,650, filed Jul. 10, 2007, de Kleer.

*Wikipedia*, Ring oscillator-Wikipedia, the free encyclopedia, 2007. [Online accessed Jun. 17, 2008].

Dague et al., "When Oscillators Stop Oscillating", in *Proc. 12th Int. Joint conf. on Artificial Intelligence*, pp. 1109-1115, Sydney, Australia, Aug. 1991.

Kaul et al., "An Artificial Intelligence Approach to Multi-Level Mixed-Mode Qualitative Simulation of CMOS ICs", *Comput. Electr. Eng.*, 20(5):369-382, 1994.

Brglez et al., "Accelerated ATPG and Fault Grading Via Testability Analysis", *Proceedings of ISCAS* 85, CH2114-7/85/0000-0695, 1985 IEEE, pp. 695-698.

European Search Report, EP Appl. No. 07864780.7-2216 / 2153240 PCT/US2007085516; Mailed Apr. 15, 2011, Completed Apr. 8, 2011; Munich, DE.

European Office Action, Application No. 07864780.7-2216, Dated Feb. 14, 2012, additional search results, 7 pages.

Fijany, Amir et al., "A Novel Model-Based Diagnosis Engine: Theory and Applications", in proceedings of the Aerospace Conference, Mar. 8-15, 2003, vol. 2, pp. 901-910.

Hamscher, W., "Modeling Digital Circuits for Trouble-Shooting: An Overview", Proceedings of the Sixth Conference on Aritficial Intelligence Applications, May 5-9, 1990, Santa Barbara (CA, USA), Vol. 1, pp. 2-8.

* cited by examiner

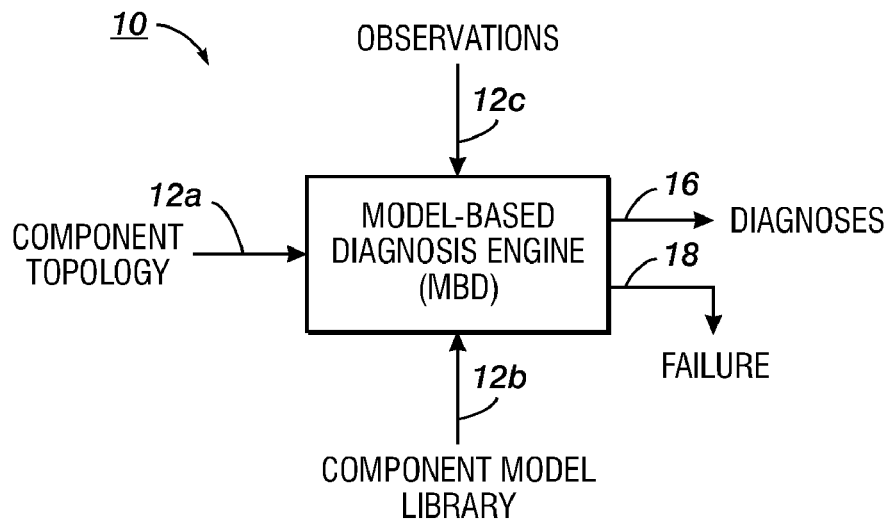
FIG. 1
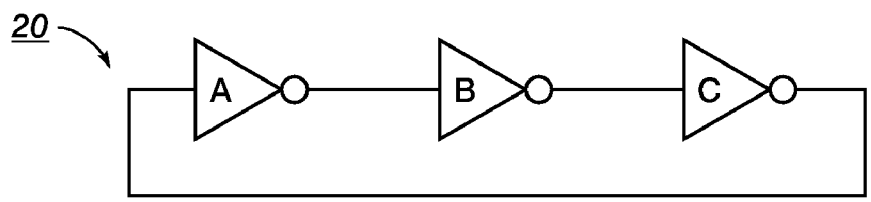
FIG. 2
| t | 0 | 1 | 2 | 3 | 4 | 5 | 6 |
|---|---|---|---|---|---|---|---|
| A | 1 | 1 | 1 | 0 | 0 | 0 | 1 |
| B | 1 | 0 | 0 | 0 | 1 | 1 | 1 |
| C | 0 | 0 | 1 | 1 | 1 | 0 | 0 |
FIG. 3

FIG. 4
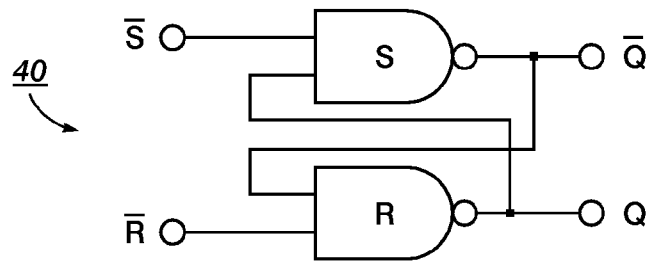
FIG. 5
| R̄ | S̄ | Q | Q̄ |
|---|---|---|---|
| 0 | 0 | 1 | 1 |
| 0 | 1 | 1 | 0 |
| 1 | 0 | 0 | 1 |
| 1 | 1 | ? | ? |
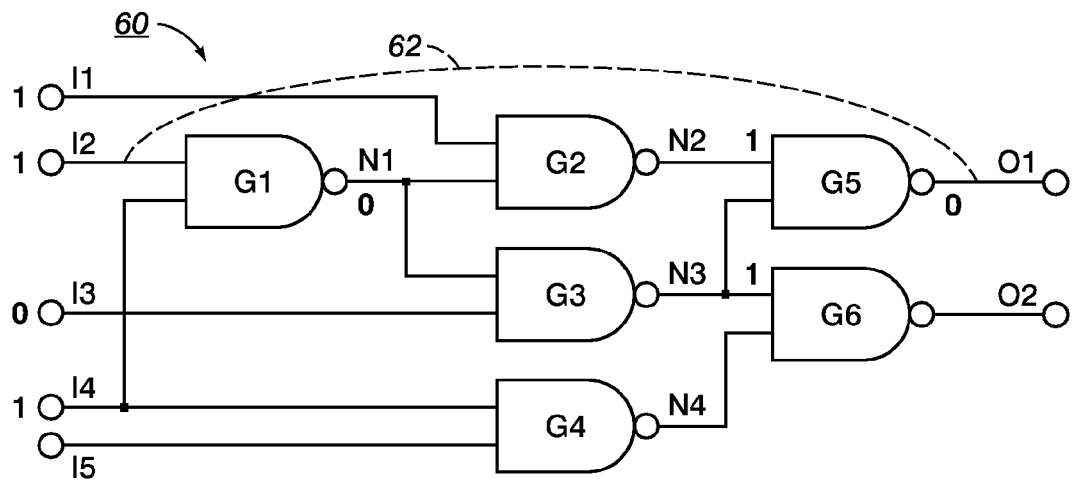
FIG. 6

US 8,271,257 B2

TROUBLESHOOTING TEMPORAL BEHAVIOR IN "COMBINATIONAL" CIRCUITS

This application claims priority to U.S. Provisional Application No. 60/931,526, filed May 24, 2007, entitled "Troubleshooting Temporal Behavior in 'Combinational'Circuits" by Johan de Kleer, the disclosure of which is hereby incorporated by reference in its entirety.

BACKGROUND

Model-based diagnosis (MBD) involves model-based testing in which test cases are derived in whole or in part from a model that describes some, usually functional, aspects of the system under test. The model is usually an abstract, partial representation of the system under test-desired behavior. The test cases derived from this model are functional tests on the same level of abstraction as the model.

Model-based diagnosis is diagnostic and system-directed. Particularly, it starts with the observed misbehavior and works back toward the underlying components that may be broken.

Model-based diagnosis may be employed in a variety of arenas, including detecting faulty system behavior, identifying faulty components, repairing of the system, and reconfiguring of the system. Other areas to which MBD may be applied, include debugging cognitive models, designing experiments to build improved models of gene pathways, troubleshooting power grids, troubleshooting manufacturing lines, identifying faults in spacecraft, airplanes, and debugging programs, among other uses.

However, an issue related to the diagnosis of systems using MBD as well as other testing approaches, such as "ad hoc" hand-coded rules, machine learning of patterns, D-algorithm searching, and analytical redundancy relationships, among others, concerns digital circuits that may contain intentional or unintentional cycles in its combinational logic. Particularly, such circuits often produce instant contradictions when analyzed at the logical gate level.

Therefore, the present application addresses the challenge of reasoning and diagnosing such digital circuits, as these intentional or unintentional cycles can lead to oscillatory behavior or convert what seems at first to be a combinational circuit into to a sequential one.

INCORPORATION BY REFERENCE

U.S. application Ser. No. 11/940,493 filed Nov. 15, 2007, entitled "DIAGNOSING INTERMITTENT FAULTS", by Johan de Kleer; and U.S. application Ser. No. 11/925,444 filed Oct. 30, 2007, entitled "DYNAMIC DOMAIN ABSTRACTION THROUGH META-ANALYSIS", by Johan de Kleer.

BRIEF DESCRIPTION

A method and computer product is provided to generate a signal model for use in analyzing a model system including imposing an explicit time assumption for each time instant of the system model. The time assumptions are defined so that any two assumptions contradict each other, thereby separating all inferences into the respective times. A non-monotonic rule is applied to instantiate component models of the model system. Results are defined as not depending on the existence of a previous time instant and, a simplified signal model is generated, wherein the signal model represents the evolution of a value in the model system over time.

BRIEF DESCRIPTION OF THE DRAWINGS

FIG. 1 illustrates the main inputs and outputs of a model-based diagnosis engine;

FIG. 2 is a simple ring oscillator;

FIG. 3 illustrates outputs of the inverters of a ring oscillator after t gate delays, the oscillator taking six gate delays to return to its initial state, thus the output is a square wave with a period of six times the gate delay;

FIG. 4 illustrates SR flip-flop and consists of two cross-coupled NAND gates;

FIG. 5 is a Truth Table for SR flip-flop;

FIG. 6 illustrates short circuits which cause undesired oscillation;

DETAILED DESCRIPTION

Figure 7:
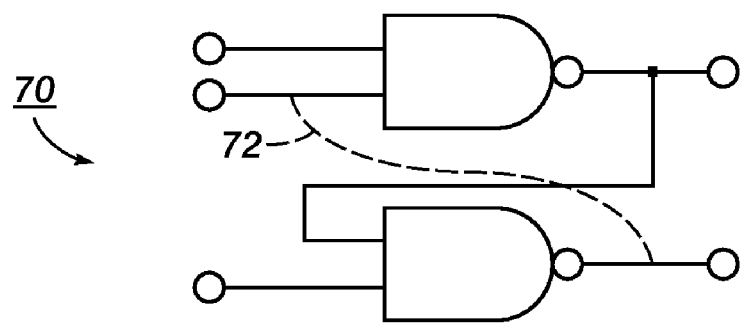
FIG. 7 illustrates a short circuit which creates memory.

FIG. 1 characterizes the main inputs and outputs of a model-based, component-based diagnosis (MBD) engine architecture 10. Given the component topology (e.g., the schematic for analog circuits) 12a, component models (e.g., resistors obey ohm's law) 12b and observations (e.g., the voltage across resistor R6 is 4 volts) 12c, model-based diagnosis (MBD) engine 14 computes diagnoses 16 which explain all the observations 12c. Observations inconsistent with expectations guide the discovery of diagnoses. When the model-based diagnosis (MBD) engine can find no diagnoses it signals a failure 18.

The GDE framework includes having the behavior of components expressed as constraints or as conventional rules. GDE can use an Assumption-Based Truth Maintenance System (ATMS) to record all the conclusions it draws from these models and the observations.

GDE computes a posterior probability for each candidate diagnosis. Given component failure probabilities and assuming components fail independently, GDE assigns a prior probability to each diagnosis. As observations accumulate the (posterior) probabilities of diagnoses shift according to Bayes' rule. Candidate diagnoses which are logically eliminative by the evidence receive probability 0. Although GDE uses the consistency-based definition of diagnosis (as opposed to the abductive definition), applying Bayes' rule raises the posterior probabilities of those diagnoses that entail the observation compared with those that are just consistent with it. As a consequence, its use of Bayes' rule to update probabilities results in GDE exhibiting a synthesis of the properties of consistency-based diagnosis and of abduction-based diagnosis.

To determine what is actually wrong with a system usually requires obtaining additional measurements. In one embodiment, GDE performs sequential diagnosis by choosing the best measurement to make next. It commonly uses a one-step look-ahead function based on minimum entropy (e.g., a myopic minimum entropy strategy). GDE proposes a set of measurements to make which will, on average, require a minimum number of measurements to localize the correct diagnosis.

An Assumption-based Truth Maintenance System (ATMS) and Hybrid-Truth Maintenance System (HTMS) framework involves, a propositional inference engine designed to simplify the construction of problem solvers that search complex problem spaces efficiently. The ATMS represents problem states with assumptions, which correspond to primary binary choices, and nodes, which correspond to propositions whose truth is dependent on the truth of the assumptions. Dependency relationships among assumptions and nodes are determined by a domain-specific problem solver such as a conventional inference engine. The problem solver presents these relationships to the ATMS as clauses and justifications. The ATMS determines which combinations of assumptions are consistent and identifies the conclusions to which they lead.

The ATMS is conventionally utilized by combining it with a conventional inference engine appropriate to the problem being solved. The extension includes a propositional reasoner and an interface that receives calls from the inference engine, passes them to the propositional reasoner, and returns results to the inference engine. The inference engine, the interface, and the propositional reasoner all run on a single serial processor, through conventional programming techniques.

The concepts described herein are directed to creating models which represent signals over time. These new models provide a way to analyze and successfully troubleshoot digital circuits that may contain intentional or unintentional cycles in the combinational logic of such circuits. In one embodiment this is accomplished by providing a temporal extension to the known GDE framework. The temporal analyses presented here may extend both the basic GDE-style models and connection models which do not require special-case post-processing and which are computationally tractable. In this application the following simplifying assumptions are made:

All gate delays are equal.
Signals take no time to propagate through connections.
Does not take advantage of non-intermittency axioms.

2 MOTIVATING EXAMPLES

Consider the three inverter circuit of FIG. 2. This is a well-known common circuit used to generate clock signals in digital circuits. It is easy to wire three inverters (A,B,C) together—the system is physically realizable and connecting the inverters in this way does not damage them. FIG. 3 illustrates a truth table 30 for the ring oscillator 20, where it is shown that after t gate delays, the oscillator taking six (0-6) gate delays to return to its initial state, thus the output is a square wave with a period of six times the gate delay;

However, using a usual model for gates, for example as in a GDE framework or extended models for connections which do not require special-case post-processing and which are computationally tractable, the system, such as the GDE system, will immediately detect a contradiction concluding that at least one of the components or nodes is necessarily faulted. This is true even though in a real world (e.g., physical world) implementation, none of the inverters may be faulted. Therefore the issue is with the modeling used to perform the investigation and/or analysis.

FIG. 4 illustrates an SR flip-flop 40. FIG. 5 describes a truth table 50 for the circuit 40. The final line in the truth table represents two possible states the flip-flop could be in, and the values of Q and $\overline{Q}$ depend on previous history. If the preceding inputs were $\overline{S}$=0 and $\overline{R}$=1, then Q will become 1 and $\overline{Q}$ will become 0 (corresponding to setting the flip-flop). Symmetrically, if the inputs are flipped, the outputs will be flipped (corresponding to resetting the flip-flop). If the inputs change to 1's then Q and $\overline{Q}$ will retain their previous values. The SR flip-flop is the central way static memory elements are created in VLSI design.

FIG. 6 shows a digital circuit 60, with a connection short 62 which can cause unintended oscillation in a benchmark circuit such as circuit c17 from the widely available combinatorial logic test suite ISCAS-85. With the inputs as indicated, the output at O1 should be 0. If O1 is shorted to I2, the circuit will oscillate. Modeling connections (e.g. extended models for connections which do not require special-case post-processing and which are computationally tractable), O1 will pull down I2 to 0, the output of the NAND gate G1 will change from 0 to 1, and thus the output of the NAND gate G5 will switch to 1. O1 is shorted to I2, so it will now return to 1. The circuit will continue oscillating in this manner forever. When modeled with GDE and the connection models (e.g., the extended models for connections which do not require special-case post-processing and which are computationally tractable), this circuit with these inputs are completely contradictory and the correct fault is therefore completely eliminated from consideration. Many sets of design rules used in VLSI design try to minimize such hard to isolate faults by not allowing inputs to run adjacent to outputs.

FIG. 7 depicts a digital circuit 70 with a commonly occurring CMOS short 72 which creates an SR flip-flop unintentionally. This is hard to troubleshoot because a previously simple combinational circuit now has state. The present application addresses this issue, as described below.

3 MODELING COMPONENTS

The conventional GDE model for an inverter is:
INVERTER $(x) \rightarrow [\neg AB(x) \rightarrow [in(x,t)=0 \equiv out(x,t)=1]]$.
Modeling an inverter as having a single delay $\Delta$, the model changes to:
INVERTER$(x) \rightarrow [\neg AB(x) \rightarrow [in(x,t)=0 \equiv out(x,t+\Delta)=1]]$.

To accommodate connection failures, signals on wires must be modeled at a more detailed level. Each terminal of a component is modeled with two variables, one which models how the component is attempting to influence its output (roughly analogous to current), and the other which characterizes the result (roughly analogous to voltage). For a correctly functioning node, these voltage-like variables are equal. There are 5, mutually inconsistent, qualitative values for the influence of a component on a node (we refer to these as "drivers" "d").

$D(-\infty)$ indicates a direct short to ground.

$d(0)$ pull towards ground (i.e., 0).

$d(R)$ presents a high (i.e., draws little current) passive resistive load.

$d(1)$ pull towards power (i.e., 1).

$d(+\infty)$ indicates a direct short to power.

Intuitively, these 5 qualitative values describe the range of possible current sinking/sourcing behaviors of a component terminal. A direct short to ground can draw a large current inflow. A direct power to ground can drive a large current outflow. There are three possible qualitative values for the result variable ("s"):

$s(0)$ the result is close enough to ground to be sensed as a digital 0.

$s(x)$ the result is neither a 0 or 1.

$s(1)$ the result is close enough to power to be sensed as a digital 1.

With these connection models, the inverter is modeled as:

INVERTER(x)→[¬AB(x)→[s(in(x,t))=s(0)→
  d(out(x,t))=d(1)
∧s(in(x,t))=s(1→d(out(x,t))=d(0)
∧d(in(x,t))=d(R)
∧d(out(x,t))=d(0)∨d(out(x,t))=d(1)]].

Modeling the inverter to more accurately describe both temporal and causal behavior:

INVERTER (x) [¬AB(x)→[s(in(x,t))=s(0)→d(out(x,t−Δ))=d(1)
∧s(in(x,t))=s(1)→d(out(x,t+Δ))=d(0)
∧d(in(x,t))=d(R)
∧b(out(x,t+Δ))=d(0)∨d(out(x,t+Δ))=d(1)]]

4 REPRESENTING TIME

Our implementation is based on the ATMS/HTMS structure. Each time instant is modeled by an explicit assumption t=i and any two time assumptions contradict each other. These assumptions separate all inferences into their respective times. However, to instantiate the component models which incorporate evolving time, a non-monotonic ATMS rule is required. An instantiation of the model for a particular inverter A is encoded in the following two clauses (the implication x ∧y ∧ . . . →z is equivalent to the logical clause ¬x ∨¬y ∨ . . . →z and the literal ¬(q=0) is equivalent to literal q=1):

AB(A)∨in(A,t)=1 ∨[out(A,t+Δ)=1]
AB(A)∨in(A,t)=0∨[out(A,t+Δ)=0].

However, time is implicitly represented, by explicit assumptions. So the assumption for t=i would be implicit in any deduction for in(A, i). Any deduction of in(A) will have a single t=i assumption. We introduce a new modal operator N which specifies that its argument holds in the next point beyond its antecedent. So the two inverter clauses become:

AB(A)∨in(A)=1∨N[out(A)=1]
AB(A)∨in(A)=0∨N out(A)=0].

These clauses are modeled in the ATMS by the following non-monotonic inference rule: Every (final or intermediate) prime implicate of the form, $AB(c_1) \lor \ldots \lor AB(c_n) \lor \neg(t=i) \lor N(x)$ is rewritten:

$AB(c_1) \lor \ldots \lor AB(c_n) \lor \neg(t=i+1) \lor x$.

This rule is non-monotonic because the result no longer depends on the existence of the previous time instant. Without this inference rule, it would not be possible to model evolution of time as time is inherently non-monotonic.

An advantage of this scheme to represent time is that it is not necessary to make multiple copies of component models for each time. Once the clauses representing the system model are represented, all further propagations are accomplished through the ATMS.

Suppose the input to the first inverter of the ring oscillator is observed to be 0 at $t_1$. Inference proceeds as follows:

| t | deduction |
|---|---|
| 1 | AB(A) ∨ ¬(t = 1) ∨ N[out(A) = 1] |
| 2 | AB(A) ∨ ¬(t = 2) ∨ [out(A) = 1] |
| 2 | AB(A) ∨ AB(B) ∨ ¬(t = 2) ∨ N[out(B) = 0] |
| 3 | AB(A) ∨ AB(B) ∨ ¬(t = 3) ∨ [out(B) = 0] |
| 3 | AB(A) ∨ AB(B) ∨ AB(C) ∨ ¬(t = 3) ∨ N[out(C) = 1] |
| 4 | AB(A) ∨ AB(B) ∨ AB(C) ∨ ¬(t = 4) ∨ [out(C) = 1] |
| 4 | AB(A) ∨ AB(B) ∨ AB(C) ∨ ¬(t = 4) ∨ N[out(A) = 0] |
| 5 | AB(A) ∨ AB(B) ∨ AB(C) ∨ ¬(t = 5) ∨ out(A) = 0 |

All subsequent inferences follow the same pattern. No new assumptions will be added.

5 MODELING THE RING OSCILLATOR

Figure 8:
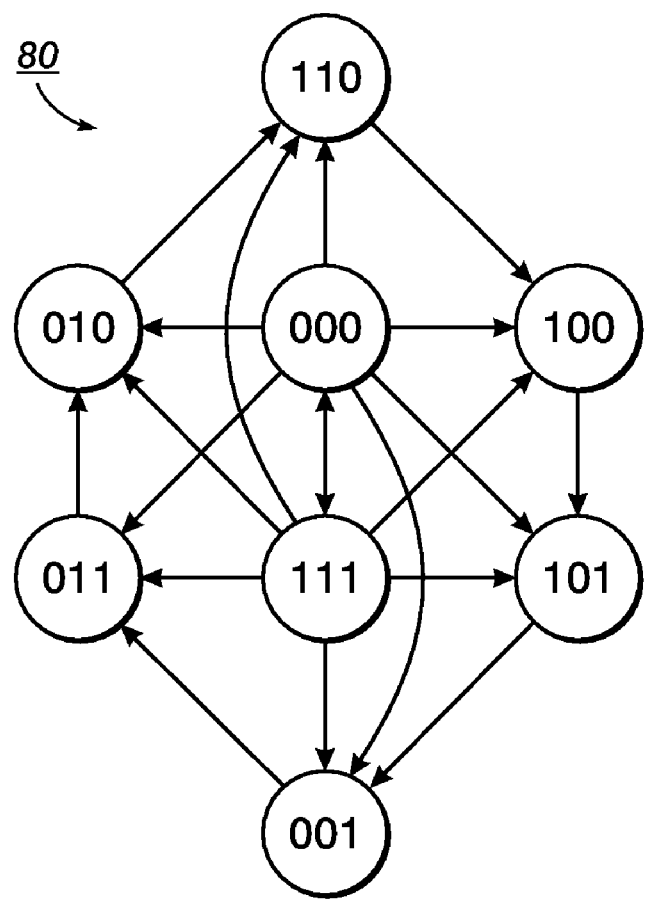
FIG. 8 shows an envisionment for the ring oscillator, with the vertices labeled with the values for the outputs of A, B, C respectively.
Figure 11:
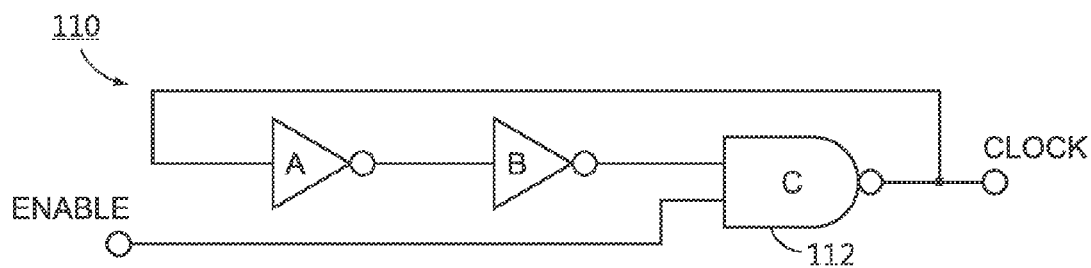
FIG. 11 shows a better designed ring oscillator, where when the clock is enabled, the ring oscillator will start in a known good state: 011.
Figure 13:
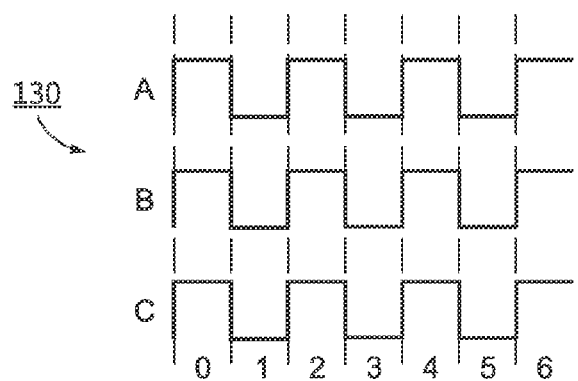
FIG. 13 shows undesired spurious oscillation of the ring oscillator.

Applying the temporal models produces the envisionment 80 of FIG. 8, for the ring oscillator 20 of FIG. 2. The vertices in FIG. 8 are labeled with the values for the outputs of A, B, C respectively. The usual states associated with a ring oscillator are described by the states on the outside of the envisionment figure. This corresponds to a stable oscillation of period six gate delays. This oscillation is stable because there are no ambiguous transitions. However, there are two spurious states in a meta-stable oscillation at the center of the envisionment diagram. Over time one of the gate delays will be slightly longer or shorter and the others and the system will transition to one of the 6 stable states. All transitions out of 000 and 111 are ambiguous because multiple transitions are happening simultaneously. While in the 000-111 oscillation will look like the undesired spurious oscillation 130 FIG. 13. For this reason, most practical ring oscillators have an enabled input (See, circuit 110 of FIG. 11 with NAND-gate 112) so that the circuit starts in a known stable state.

Figure 9:
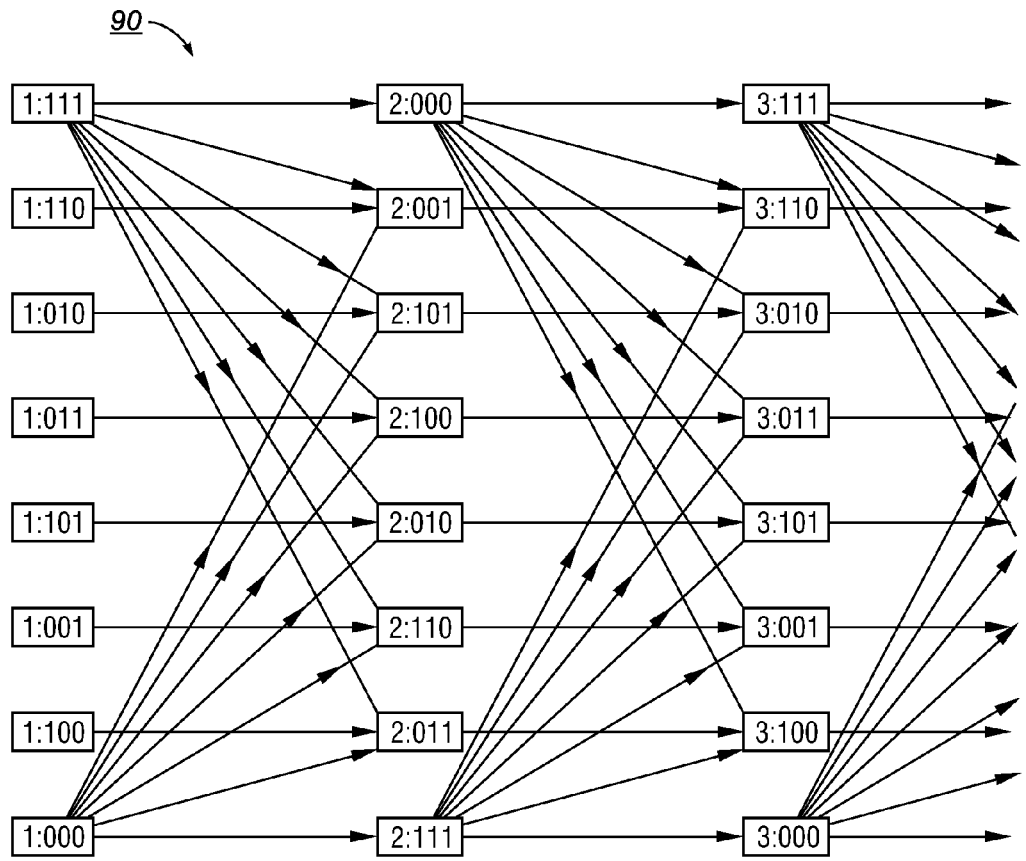
FIG. 9 shows a qualitative simulation of the ring oscillator, with the vertices being labeled: t:A,B,C where t is the time in gate delays and A,B,C are outputs of the respective inverters.
Figure 10:
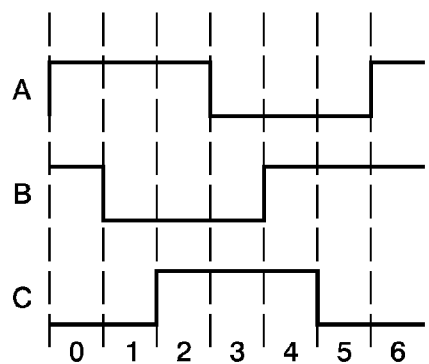
FIG. 10 illustrates the desired output of the ring oscillator.

FIG. 9 shows a qualitative simulation 90 of the ring oscillator, with the vertices being labeled: t:A,B,C where t is the time in gate delays and A,B,C are outputs of the respective inverters and FIG. 10 illustrates the desired output 100 of the ring oscillator.

6 SIGNALS

Figure 12:
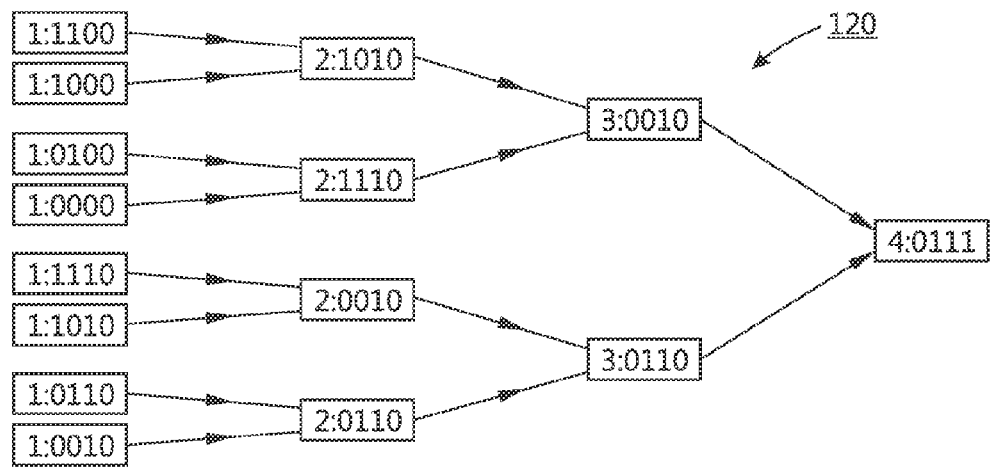
FIG. 12 illustrates the oscillatory behavior of the better ring oscillator, the vertices being labeled t:nnnn: t is the time, nnnn are the outputs of gates A,B,C and the enable input, and the enable signal is 000*1.
Figure 14:
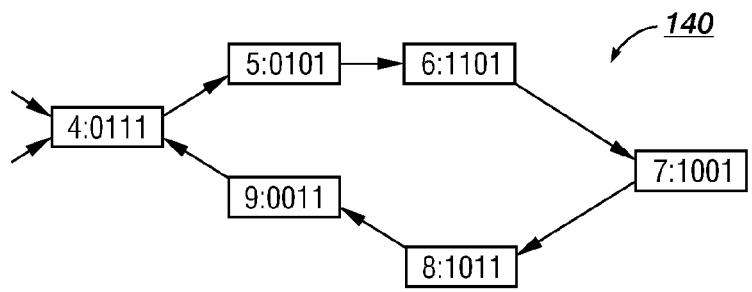
FIG. 14 illustrates qualitative simulation of the better ring oscillator, with vertices being labeled t:nnnn: t is the time, nnnn are the outputs of gates A,B,C and the enable input, with the enable signal being 000*1.

The notation f(g, t) (e.g., in(A, t)) to represent values is a clumsy approach to represent a changing value for time (a fluent). We introduce a notion of signal:

Definition 1: A signal represents the evolution of a value over time (at the granularity of a gate delay). It is represented by a sequence of symbols drawn from 0,1,?,>,*. 0,1 indicate their respective values, "?" indicates the value is unknown, ">" indicates a large (unknown) number of gate delays, and "*" means that the following pattern repeats. A signal may have only one "*" and it must occur at the earliest possible place. We call signals containing a * followed by both 1's and 0's as definitely oscillatory. We call signals in which * is followed by exactly one symbol 0 or 1 as steady. Examples of valid signals are:

*0 the steady signal always 0.
>*1 the steady signal eventually 1.
>*000111 the oscillatory output of a 3 gate ring oscillator Signals are used to describe all of a system's variables. FIG. 14 shows a continuation 140, of the simulation 120 of FIG. 12. Particularly 140 shows the resultant signal at the output of the ring oscillator is: ?*111000. This extended GDE, infers not just the values of variables at particular time points (such as in(A, $t_1$)) but also all the most general signals (presuming all signals eventually have a repeating pattern). The assumptions supporting this derivation are the assumptions of its constituent components:

AB(A)∨AB(B)∨AB(C)∨(C=?*111000)

On the surface, these derivations don't seem to have much diagnostic power, as in most cases the signals will be depend on the non-ABnormal behavior of all the components of the system.

Figure 15:
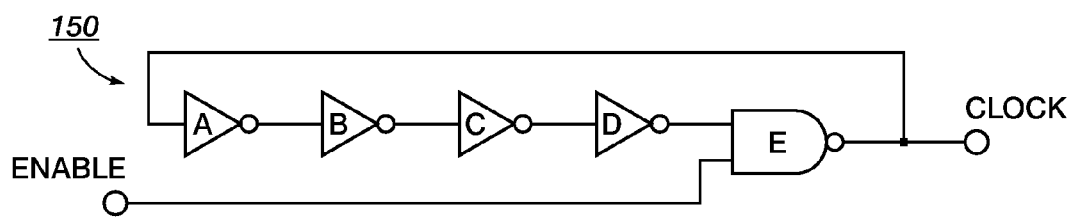
FIG. 15 depicts a five-gate ring oscillator.

To illustrate the diagnostic power of inferring complex signals consider a slightly more complex ring oscillator 150 of FIG. 15 consisting of four inverters and one NAND-gate. Assuming the input is 00000*1. GDE will compute an output of >*0000011111. Suppose the output is observed to be *0. Then it is immediately noticed that there is a conflict:

AB(A)∨AB(B)∨AB(C)∨AB(D)∨AB(E)∨AB(G)

Figure 16:
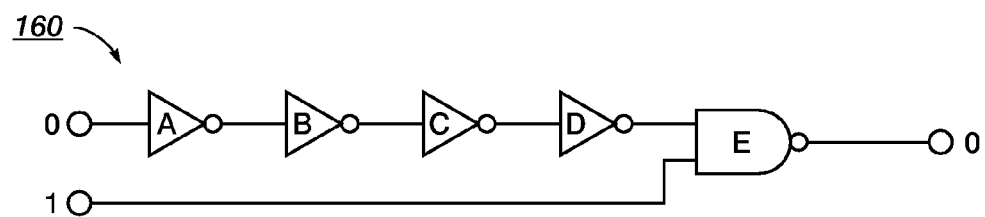
FIG. 16 illustrates a faulty five-gate ring oscillator observed at quiescence.

The observation *0 is propagated (as it would if a simple 0 were observed). If all components are equally likely to fail, the usual GDE probing strategy will choose the next measurement (either the output of B or C) and the gate causing the failure to oscillate can be isolated as usual. More intuitively, as we are observing the system when all observations and inputs are steady, the circuit looks like circuit 160 of FIG. 16 which can be easily diagnosed.

Figure 17:
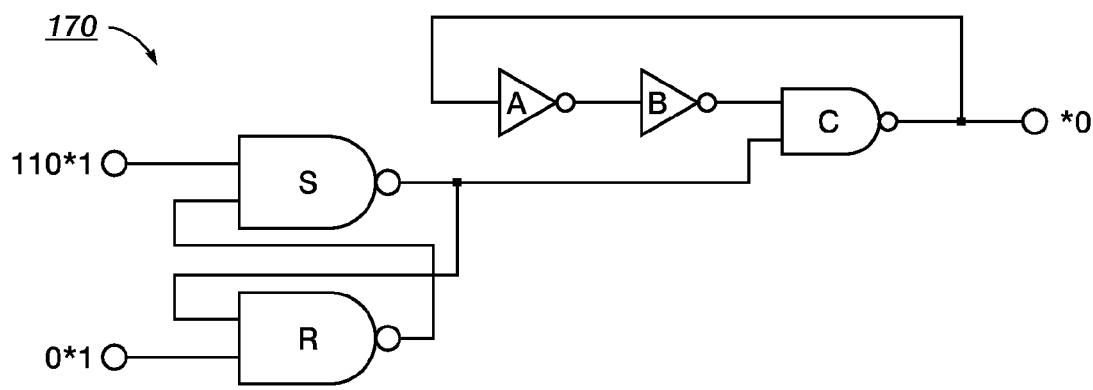
FIG. 17 shows a flip-flop combined with a ring oscillator, with the figure showing the initial inputs, and it is observed at quiescence: S=*0, R=*1, C=*0, B=*1, A=*1 which is consistent with all the component models, yet the output is incorrect.

Consider now circuit 170 of FIG. 17 which combines an SR flip-flop with a ring oscillator. The purpose of this circuit is to ensure the clock is on (it might be on already) when the flip-flop sees a single negative pulse at S. Suppose the clock output is observed to be quiescent 0. Observed at quiescence every component is obeying its io-behavior: S=*0, R=*1, C=*0, B=*1, A=*1, yet the circuit is faulted. With the two given inputs at quiescence being 1, the outputs of S and R cannot be definitively inferred. Even though we observe S to be *0, at quiescence that cannot be inferred. So that observation provides no information about whether S or R are faulted or not. Fortunately, the fault at S and R can be directly determined by the basic propagation of signals. Given the observations as shown, the signal at the output of S should be ???1* hence one of S or R are faulted. For example, S stuck at 0, or R stuck at 1 would explain the observation. The reason it is hard to diagnose at quiescence is that S stuck at 0 is the same output as it were working correctly. The fault occurred in the past.

The preceding discussion illustrated a process and system which allows for the troubleshooting or analysis of temporal behavior in combinatorial circuits. In a general sense, and as described in FIG. 18, a simple model of system signals are generated which makes it possible to analyze and successfully troubleshoot digital signals which contain either intentional or unintentional cycles in the combinatorial logic of the circuit system.

Figure 18:
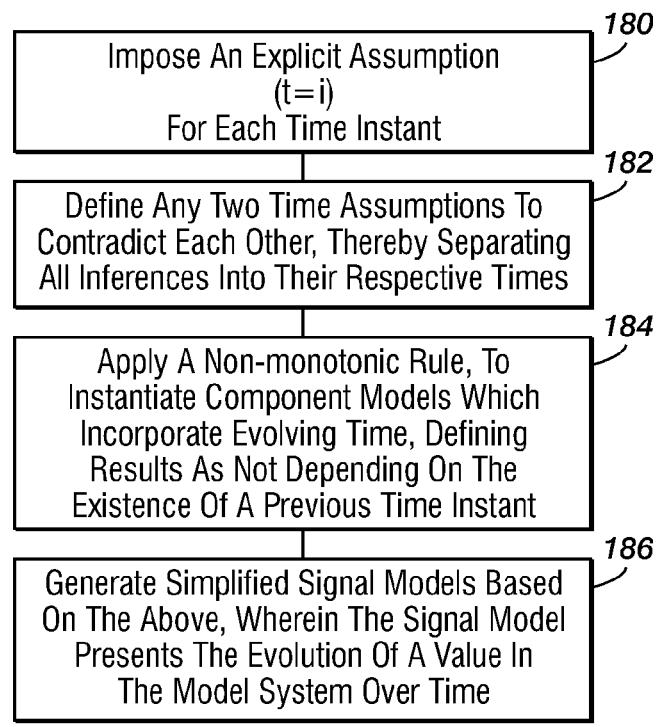
FIG. 18 illustrates a first flow diagram.

The overview flow diagram of FIG. 18 illustrates these concepts. Particularly, in step 180 an explicit assumption is imposed (t=i) for each time instant. Then, any two time assumptions are defined to contradict each other, thereby separating all inferences into their respective times, step 182.

Thereafter, a non-monotonic rule is applied to instantiate component models which incorporate evolving time. Results are then defined as not depending on the existence of a previous time instant, step 184. Thereafter, simplified signal models are generated based on the above, where a signal represents the evolution of a value in a system over time, step 186.

Figure 19:
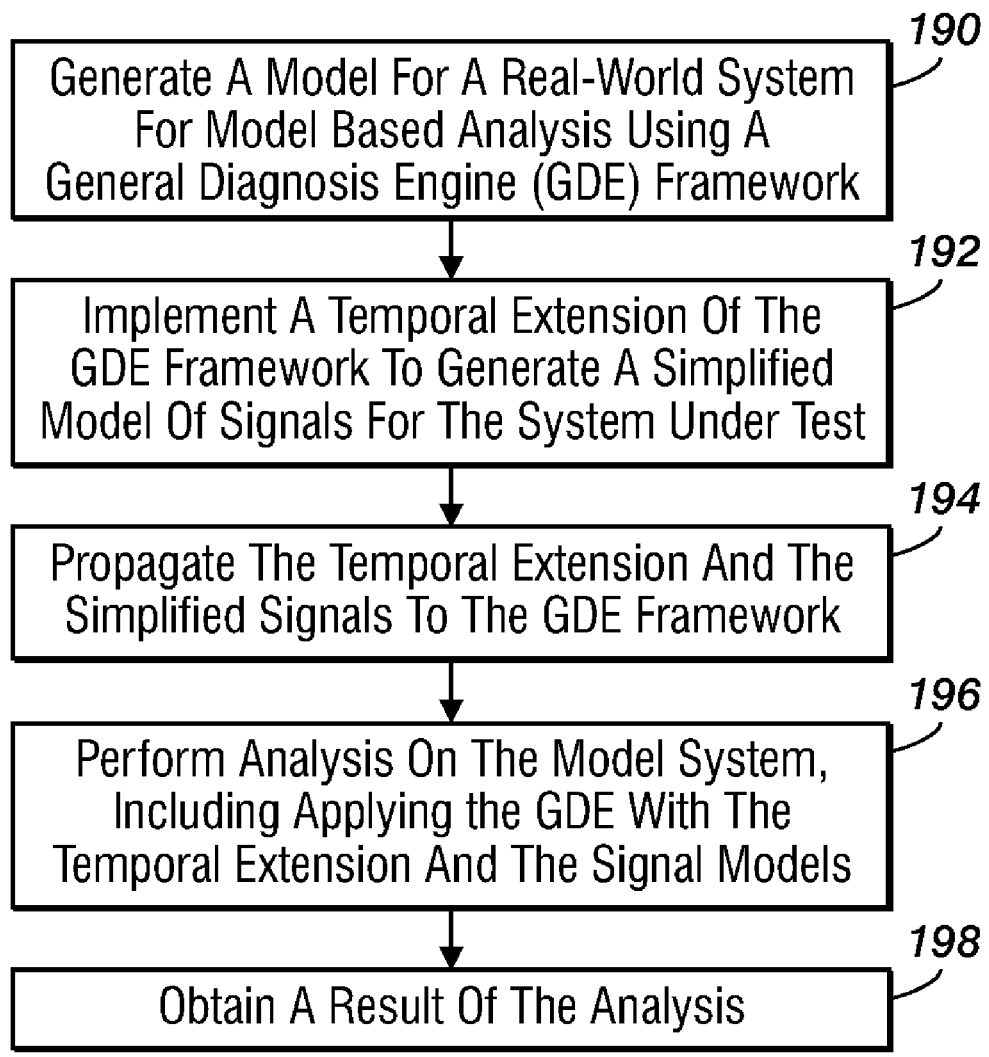
FIG. 19 illustrates a second flow diagram.

These concepts are at times more particularly applied to a GDE framework as shown in the flow diagram of FIG. 19. Particularly, a model for a real world system is generated for model based analysis using a GDE framework, step 190. A temporal extension of the GDE framework is implemented to generate a simplified model of signals for the system under test, step 192. Then the temporal extension and the simplified signals are propagated to the GDE framework, step 194. Analysis is performed on the system under test, including application of the GDE framework with the temporal extension, step 196. Results of the analysis are then obtained, step 198.

7 RELATED WORK

Others have focused on troubleshooting analog oscillators which stopped oscillating, as well as on simulating CMOS designs with Qualitative Reasoning Systems or Software (QSIM). Neither approach generalized to explicitly recording assumptions of good behavior in order to isolate the malfunctioning component through more observations.

Figure 20:
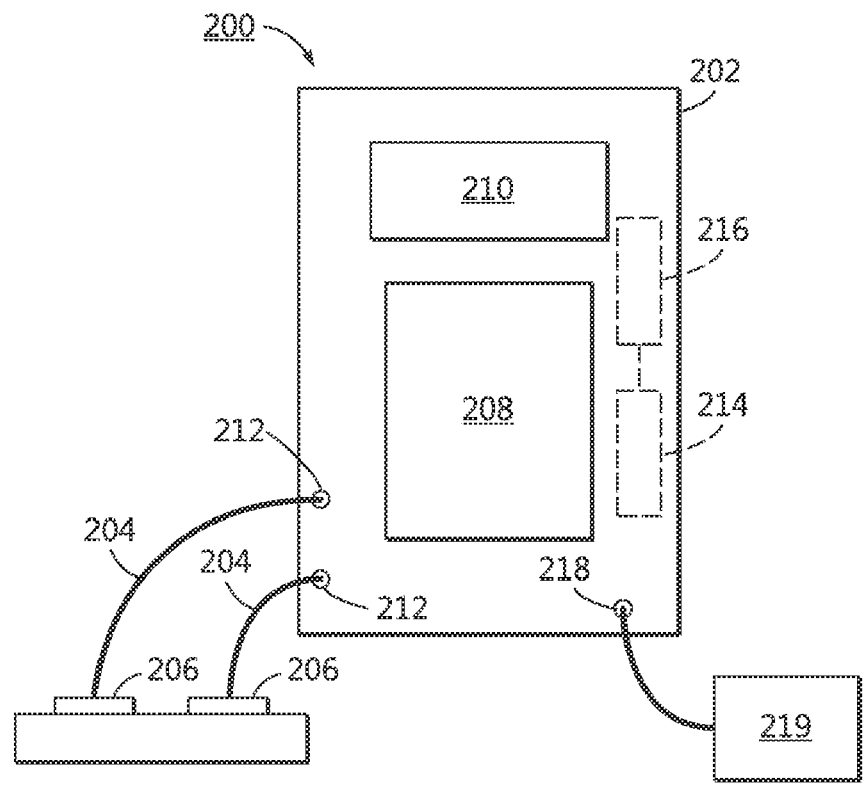
FIG. 20 is directed to one embodiment of a diagnostic device incorporating the concepts of the present application.

The preceding discussion focused on providing an improved system and method of diagnosing faults of a system under test. As previously mentioned, such diagnostic testing can be implemented in a wide range of areas. For example, as shown in FIG. 20, concepts disclosed in the present application may be embodied in a diagnostic device or system 200, including a body 202 and probes 204. Probes 204 are designed to be positioned in operative association with a device under test 206. Body 202 may include an input 208 and an output 210. The input 208 can include an alphanumeric keypad, stylus, voice, or other input design or interface known to input data or instructions. Output 210 may be any sort of display to display the results of a diagnostic investigation. Body 202 may also include a secondary set of inputs 212, wherein information detected by probes 204 are automatically input into diagnostic device 200.

It is to be understood that body 202 includes computational capabilities including at least a processor 214 and memory 216, which permits the processing of software code, including code incorporating the concepts described herein. Still further, diagnostic device or system 200 may include output 218, for connection to an output device 219 to permit the printing of hardcopies of output reports, verbally stating the output reports, or otherwise communicating the same regarding the results of the analysis or diagnostic investigation.

It is to be appreciated the above description may be implemented on customized diagnostic devices, and/or may be included as part of hand-held computers, laptops, desktops or other computing devices, including personal digital assistants. Still further, the diagnostic device or system 200 is intended only as examples of how the concepts of the present application may be implemented.

In another embodiment, FIG. 20 may not include probes 204, but rather the diagnostics may be undertaken on computer software operating on the diagnostic device, or associated with another device having computational capabilities.

Figure 21:
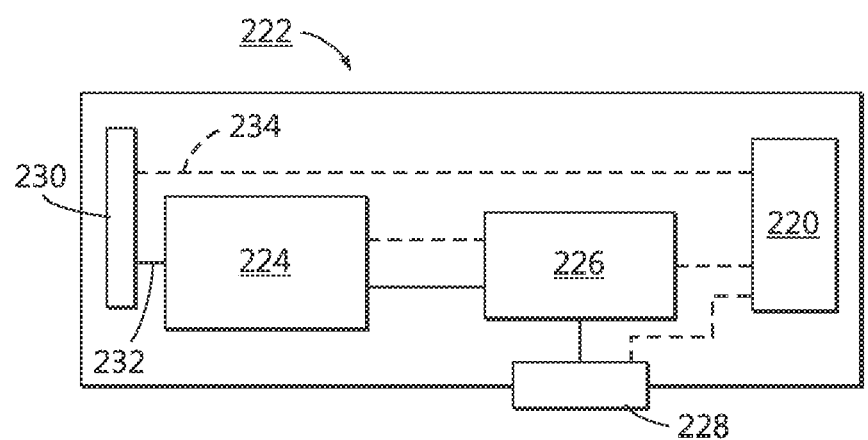
FIG. 21 is directed to an embodiment of an embedded diagnostic device.

In another embodiment illustrated in FIG. 21, the diagnostic device or system 220 is itself embedded as part of a larger overall system 222 which may, for example, include components 224-230 shown in operative connection with each other via solid lines 232. The diagnostic device or system 220, in turn is shown to be in operative connection with the components 224-230 via dotted lines 234. It is to be appreciated FIG. 21 is a high level example of a system in which a diagnostic device or system according to the present application may be used. The purpose of the diagnostic device or system 220 is to identify faults in the overall system 222 and initiate repairs without any human intervention. Examples of such overall systems, which would have components such as components 224-230, would be reprographic equipment, automobiles, spacecraft, and airplanes, among others.

8 CONCLUSIONS

This research has extended the GDE framework with a simple vocabulary to represent signals over time. The same basic architecture and inferential machinery as GDE can be used to propagate these generalized signals. Discrepancies between observed and predicted generalized signals can guide diagnosis to isolate the faulty system component(s). These generalized signals capture temporal behavior over time so they can be used to troubleshoot sequential circuits (e.g., containing flip-flops) as well. Sequential circuits can be hard to diagnose because no symptom maybe observable at quiescence. With these extensions GDE can be used to troubleshoot a far wider range of circuits than previously.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method of generating a signal model for use in analyzing a model system comprising:
   imposing an explicit time assumption for each time instant of the model system;
   defining any two of the time assumptions to contradict each other, thereby separating all inferences into their respective times;
   applying the inferences of a non-monotonic rule to instantiate component models of the model system;
   defining results from the non-monotonic rule as not depending on an existence of a previous time value; and
   generating a simplified signal model based on the results, wherein the signal model represents an evolution of a value in the model system over time, wherein the method is performed by use of a device having computational capabilities and at least one electronic processor.

2. The method according to claim 1 wherein the explicit time assumption is t=i, where t is a time value and i is an instant value in the non-monotonic rule.

3. The method according to claim 1 wherein the signal model is described by abstraction both over time and by underlying assumptions.

4. The method according to claim 1 wherein the signal model is modeled in an Assumption-Based Truth Maintenance System (ATMS).

5. The method according to claim 1 wherein once clauses representing the system model are represented, propagations through the model system are by an Assumption-Based Truth Maintenance System.

6. The method according to claim 1 wherein signal models are used to describe all values of the model system.

7. A method of troubleshooting temporal behavior in combinatorial systems comprising:
   generating a model system of a real world system for model based analysis using a general diagnostic engine (GDE) framework;
   implementing a temporal extension of the GDE framework to generate a simplified model of simplified signals for the model system;
   propagating the temporal extension and the simplified signals to the GDE framework;
   performing analysis on the model system, including applying the GDE framework with the temporal extension and simplified signal models;
   wherein the analysis is based on the assumptions that all gate delays are equal, signals take no time to propagate through connections, and the non-intermittency axioms are not taken advantage of; and
   obtaining a result of the analysis, wherein the method is performed by use of a device having computational capabilities and at least one electronic processor.

8. The method of claim 7 wherein implementing a temporal extension of the GDE framework includes,
   imposing an explicit time assumption for each time instant of the circuit with multiple components;
   defining any two of the time assumptions to contradict each other, thereby separating all inferences into their respective times;
   applying the inferences of a non-monotonic rule to instantiate component models of the model system;
   defining results from the non-monotonic rule as not depending on an existence of a previous time value; and
   generating a simplified signal model based on the results, wherein the signal model represents an evolution of a value in the model system over time, wherein the method is performed by use of a device having computational capabilities.

9. The method according to claim 8 wherein the explicit time assumption is t=i, where t is a time value and i is an instant value in the non-monotonic rule.

10. The method according to claim 8 wherein the signal model is described by abstraction both over time and by underlying assumptions.

11. The method according to claim 8 wherein the signal model is modeled in an Assumption-Based Truth Maintenance System (ATMS).

12. The method according to claim 8 wherein once clauses representing the system model are represented, propagations through the model system are by an Assumption-Based Truth Maintenance System.

13. The method according to claim 8 wherein signal models are used to describe all values of the model system.

14. A computer program product comprising a non-transitory computer readable medium storing non-transitory signals that when executed by a computing device, perform a method comprising:
   imposing an explicit time assumption for each time instant of the model system;
   defining any two of the time assumptions to contradict each other, thereby separating all inferences into their respective times;
   applying the inferences of a non-monotonic rule to instantiate component models of the model system;
   defining results from the non-monotonic rule as not depending on an existence of a previous time value; and
   generating a simplified signal model based on the results, wherein the signal model represents an evolution of a value in the model system over time.

15. The method stored on the medium according to claim 14, further comprising wherein value in the non-monotonic rule.

16. The method stored on the medium according to claim 14, further comprising wherein assumptions.

17. The method stored on the medium according to claim 14, further comprising wherein (ATMS).

18. The method stored on the medium according to claim 14, further comprising wherein representing the system model are represented, propagations through the model system are by an Assumption-Based Truth Maintenance System.

19. The method stored on the medium according to claim 14, further comprising wherein signal models are used to describe all values of the model system.

* * * * *